(12) United States Patent
Bair et al.

(10) Patent No.: US 10,678,670 B2
(45) Date of Patent: *Jun. 9, 2020

(54) EVALUATING FAIRNESS IN DEVICES UNDER TEST

(71) Applicant: INTERNATIONAL BUSINESS MACHINES CORPORATION, Armonk, NY (US)

(72) Inventors: Dean G. Bair, Bloomington, NY (US); Rebecca M. Gott, Poughkeepsie, NY (US); Edward J. Kaminski, Jr., Wynnewood, PA (US); William J. Lewis, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 5 days.

This patent is subject to a terminal disclaimer.

(21) Appl. No.: 16/046,574

(22) Filed: Jul. 26, 2018

(65) Prior Publication Data

US 2018/0336115 A1 Nov. 22, 2018

Related U.S. Application Data

(63) Continuation of application No. 14/501,709, filed on Sep. 30, 2014, now Pat. No. 10,055,327.

(51) Int. Cl.
*G06F 11/34* (2006.01)
*G06F 30/00* (2020.01)
(Continued)

(52) U.S. Cl.
CPC .......... *G06F 11/3409* (2013.01); *G01R 31/26* (2013.01); *G06F 13/00* (2013.01); *G06F 30/00* (2020.01); *G06F 30/33* (2020.01)

(58) Field of Classification Search
CPC .. G06F 11/3409; G06F 17/50; G06F 17/5022; G06F 13/00; G06F 30/33; G06F 30/00; G01R 31/26
See application file for complete search history.

(56) References Cited

U.S. PATENT DOCUMENTS 5,136,705 A 8/1992 Stubbs
5,155,836 A 10/1992 Jordan
(Continued)

OTHER PUBLICATIONS z/Architecture—Principles of Operation, Publication No. SA22-7832-09, 10$^{th}$ Edition, Sep. 2012, pp. 1-1568.
(Continued)

*Primary Examiner* — Helen Rossoshek
(74) *Attorney, Agent, or Firm* — William A. Kinnaman, Jr., Esq.; Blanche E. Schiller, Esq.; Heslin Rothenberg Farley & Mesiti P.C.

(57) ABSTRACT

Pre-silicon fairness evaluation to detect fairness issues pre-silicon. Drivers drive a plurality of commands on one or more interfaces of a device under test to test the device under test. State associated with the device under test is checked. Based on the state, a determination is made as to whether the drivers are to continue driving commands against the device under test. Based on determining that the drivers are to continue driving the commands, a further determination is made as to whether a predefined limit has been reached. Based on determining the predefined limit has been reached, ending the test of the device under test in which the test fails.

20 Claims, 11 Drawing Sheets

(51) Int. Cl.
*G06F 30/33* (2020.01)
*G01R 31/26* (2020.01)
*G06F 13/00* (2006.01)

(56) References Cited

U.S. PATENT DOCUMENTS

| | | | |
|---|---|---|---|
| 5,202,889 A | 4/1993 | Aharon | |
| 5,506,972 A | 4/1996 | Heath et al. | |
| 6,157,200 A | 12/2000 | Okayasu | |
| 6,336,088 B1 | 1/2002 | Bauman | |
| 6,360,192 B2 | 3/2002 | Dearth | |
| 6,453,276 B1 | 9/2002 | Bauman | |
| 6,571,204 B1 | 5/2003 | Meyer | |
| 6,678,625 B1 | 1/2004 | Reise | |
| 6,754,763 B2 | 6/2004 | Lin | |
| 6,874,110 B1 | 3/2005 | Camarota | |
| 7,096,289 B2 | 8/2006 | Brown et al. | |
| 7,246,332 B2 | 7/2007 | Likovich | |
| 7,321,951 B2 | 1/2008 | wong | |
| 7,421,273 B2 | 9/2008 | Diepstraten et al. | |
| 7,444,257 B2 | 10/2008 | Houihane | |
| 7,500,035 B2 | 3/2009 | Johns et al. | |
| 7,627,462 B2 | 12/2009 | Nightingale | |
| 7,661,050 B2 | 2/2010 | Huben | |
| 7,711,535 B1 | 5/2010 | Brookes | |
| 7,826,399 B2 | 11/2010 | Heil et al. | |
| 7,865,854 B2 | 1/2011 | Averill | |
| 7,966,591 B2 | 6/2011 | Thompson | |
| 8,000,954 B2 | 8/2011 | Schalick | |
| 8,370,663 B2 | 2/2013 | Frid et al. | |
| 8,479,129 B1 | 7/2013 | Kalyanaraman | |
| 8,504,973 B1 | 8/2013 | Leong | |
| 8,522,176 B2 | 8/2013 | Ho | |
| 8,626,904 B1 | 1/2014 | Olliff | |
| 8,635,376 B2 | 1/2014 | Barrett et al. | |
| 8,639,487 B1 | 1/2014 | Ezer | |
| 9,459,878 B2 | 10/2016 | Arunagirl | |
| 9,471,327 B2 | 10/2016 | Arunagirl | |
| 10,055,327 B2 * | 8/2018 | Bair | G06F 17/50 |
| 10,061,679 B2 * | 8/2018 | Bair | G06F 17/50 |
| 2005/0108596 A1 | 5/2005 | Deaton | |
| 2008/0262821 A1 | 10/2008 | Phan et al. | |
| 2009/0265534 A1 | 10/2009 | Averill et al. | |
| 2010/0153924 A1 | 6/2010 | Andrews | |
| 2011/0050620 A1 | 3/2011 | Hristov | |
| 2011/0191725 A1 | 8/2011 | Oberai | |
| 2011/0238397 A1 | 9/2011 | Chen | |
| 2012/0151263 A1 | 6/2012 | Rentschler et al. | |
| 2013/0007330 A1 | 1/2013 | Ryzhyk | |
| 2014/0089735 A1 | 3/2014 | Barrett et al. | |
| 2014/0181767 A1 | 6/2014 | Kohavi | |
| 2016/0092334 A1 | 3/2016 | Bair et al. | |
| 2016/0092337 A1 | 3/2016 | Bair | |
| 2018/0336114 A1 * | 11/2018 | Bair | G06F 17/50 |

OTHER PUBLICATIONS

Bair, Dean G. et al., "Evaluating Fairness in Devices Under Test," U.S. Appl. No. 16/046,548, filed Jul. 26, 2018, pp. 1-47.

List of IBM Patents of Patent Applications Treated as Related, Aug. 6, 2018, pp. 1-2.

* cited by examiner

100

EVALUATING FAIRNESS IN DEVICES UNDER TEST

This application is a continuation of co-pending U.S. application Ser. No. 14/501,709, entitled "EVALUATING FAIRNESS IN DEVICES UNDER TEST," filed Sep. 30, 2014, which is hereby incorporated herein by reference in its entirety.

BACKGROUND

One or more aspects relate, in general, to pre-silicon testing, and in particular, to evaluating fairness during pre-silicon testing of devices under test.

During the pre-silicon process, devices are tested in a virtual environment with sophisticated simulation, emulation and formal verification tools. In contrast, post-silicon validation tests occur on actual devices running at-speed in commercial, real-world systems. Pre-silicon testing performs various tests to determine functional correctness and/or to assess performance of the devices under test and/or the system that includes such devices.

In assessing performance, one or more criteria are considered, including fairness. Fairness relates, in general, to whether forward progress is being made for traffic (e.g., commands, instructions, and/or other types of traffic) being driven on interfaces of the device under test. Fairness, and in particular, a lack of fairness, is difficult to discover in current simulation test environments, since bus functional models, which drive traffic on the interfaces, are quiesced at pre-determined, fixed cycles. This stops new commands from being driven on the interfaces, allowing outstanding traffic—even if previously not making expected forward progress due to a fairness issue—to finish within the run out period of the testcase.

SUMMARY

Shortcomings of the prior art are overcome and additional advantages are provided through the provision of a computer-implemented method of evaluating fairness in devices under test. The computer-implemented method includes, for instance, driving, by a plurality of drivers executing on one or more processors of a computing environment, a plurality of commands on one or more interfaces of a device under test to test the device under test in pre-silicon processing for fairness; checking state associated with the device under test; determining, based on the state, whether a quiesce point is to be dynamically set for the plurality of drivers, the quiesce point to indicate to the plurality of drivers to stop driving commands against the device under test; setting, based on the determining indicating the quiesce point is to be set, the quiesce point dynamically, based on the state, to stop driving commands against the device under test and successfully ending the test; deciding, based on the determining indicating the quiesce point is not to be set, whether commands are to continue to be driven, the deciding being based on a predefined limit, and wherein based on deciding that the commands are not to continue to be driven, failing the test due to at least one fairness problem in which forward progress in not being made for one or more commands being driven on at least one interface of the one or more interfaces; and initiating correcting of the at least one fairness problem pre-silicon to provide a design of an actual device without the at least one fairness problem to be tested in post-silicon validation testing.

Computer program products and computer systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

In accordance with one or more aspects, a pre-silicon fairness evaluation facility is provided and used to detect fairness issues pre-silicon. The ability to discover such issues pre-silicon saves test floor debug time and the need to correct such problems post-silicon. This results in higher quality designs at a lower cost and savings to the production schedule.

Fairness issues include, but are not limited to, livelock, starvation, priority and/or other fairness issues. Livelock occurs when more than one command takes action causing neither to make forward progress. (Commands and instructions are used interchangeably herein unless otherwise noted either explicitly or implicitly.) Starvation is when a command is perpetually denied resources, and therefore, does not make forward progress.

Figure 1:
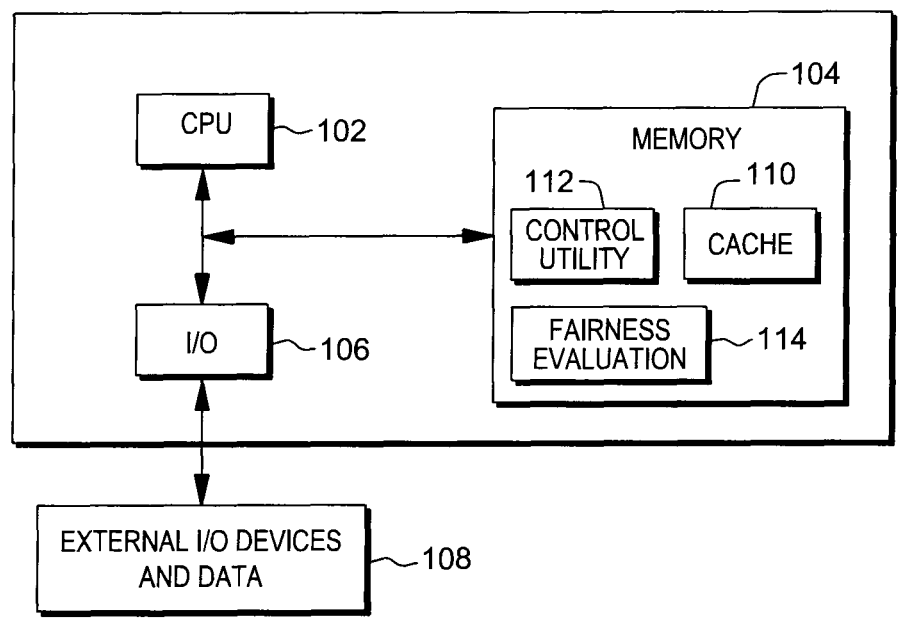
FIG. 1 depicts one embodiment of a computing environment to incorporate and use one or more aspects of a fairness evaluation technique.

One embodiment of a computing environment to incorporate and use one or more aspects of a fairness evaluation facility is described with reference to FIG. 1. Referring to FIG. 1, in one example, a computing environment 100 is based on the Power Architecture, offered by International Business Machines (IBM®) Corporation, Armonk, N.Y., and includes, for instance, a pSeries or System p server.

IBM, POWER, SYSTEM P, and AIX, Z/ARCHITECTURE, POWER ARCHITECTURE and POWERPC (referenced below) are registered trademarks of International Business Machines Corporation, Armonk, N.Y. Other names used herein may be registered trademarks, trademarks or product names of International Business Machines Corporation or other companies.

As one example, computing environment 100 includes a processor (e.g., a central processing unit—CPU) 102 communicatively coupled to memory 104 and an input/output (I/O) subsystem 106. I/O subsystem 106 is further communicatively coupled to external I/O devices 108 that may include, for example, data input devices, sensors and/or output devices, such as displays.

Memory 104 includes, for instance, one or more caches 110, at least one control utility 112, such as an operating system (e.g., AIX, offered by International Business Machines Corporation, Armonk, N.Y.), and one or more aspects of a fairness evaluation facility 114 to be executed by the processor to test devices under test.

Figure 2A:
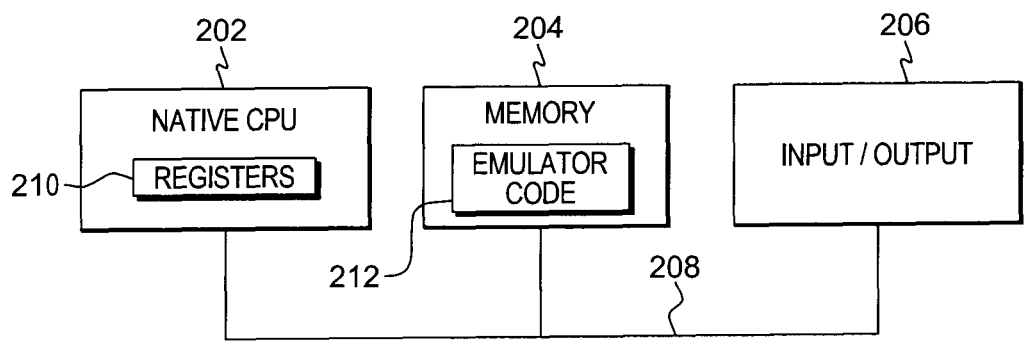
FIG. 2A depicts another embodiment of a computing environment to incorporate and use one or more aspects of a fairness evaluation technique.

Another embodiment of a computing environment to incorporate and use one or more aspects of a fairness evaluation facility is described with reference to FIG. 2A. In this example, a computing environment 200 includes, for instance, a native central processing unit (CPU) 202, a memory 204, and one or more input/output devices and/or interfaces 206 coupled to one another via, for example, one or more buses 208 and/or other connections. As examples, computing environment 200 may include a PowerPC processor or a Power Systems server offered by International Business Machines Corporation, Armonk, N.Y.; an HP Superdome with Intel Itanium II processors offered by Hewlett Packard Co., Palo Alto, Calif.; and/or other machines based on architectures offered by International Business Machines Corporation, Hewlett Packard, Intel, Oracle, or others.

Native central processing unit 202 includes one or more native registers 210, such as one or more general purpose registers and/or one or more special purpose registers used during processing within the environment that include information that represents the state of the environment at any particular point in time.

Moreover, native central processing unit 202 executes instructions and code that are stored in memory 204. In one particular example, the central processing unit executes emulator code 212 stored in memory 204. This code enables the computing environment configured in one architecture to emulate one or more other architectures. For instance, emulator code 212 allows machines based on architectures other than the z/Architecture, such as PowerPC processors, Power Systems servers, HP Superdome servers or others, to emulate the z/Architecture and to execute software and instructions developed based on the z/Architecture, or allows machines based on architectures other than the Power Architecture, such as HP Superdome Servers or others, to emulate the Power Architecture and to execute software and instructions developed based on the Power Architecture.

Figure 2B:
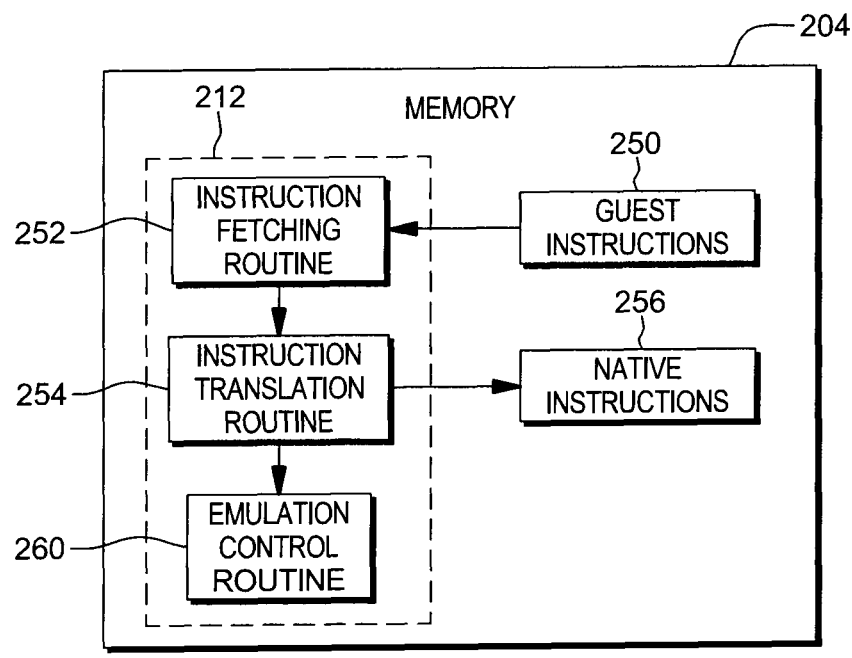
FIG. 2B depicts further details of the memory of FIG. 2A.

Further details relating to emulator code 212 are described with reference to FIG. 2B. Guest instructions 250 stored in memory 204 comprise software instructions (e.g., correlating to machine instructions) that were developed to be executed in an architecture other than that of native CPU 202. For example, guest instructions 250 may have been designed to execute on a Power Architecture (or z/Architecture) processor 102, but instead, are being emulated on native CPU 202, which may be, for example, an Intel Itanium II processor. In one example, emulator code 212 includes an instruction fetching routine 252 to obtain one or more guest instructions 250 from memory 204, and to optionally provide local buffering for the instructions obtained. It also includes an instruction translation routine 254 to determine the type of guest instruction that has been obtained and to translate the guest instruction into one or more corresponding native instructions 256. This translation includes, for instance, identifying the function to be performed by the guest instruction and choosing the native instruction(s) to perform that function.

Further, emulator code 212 includes an emulation control routine 260 to cause the native instructions to be executed. Emulation control routine 260 may cause native CPU 202 to execute a routine of native instructions that emulate one or more previously obtained guest instructions and, at the conclusion of such execution, return control to the instruction fetch routine to emulate the obtaining of the next guest instruction or a group of guest instructions. Execution of the native instructions 256 may include loading data into a register from memory 204; storing data back to memory from a register; or performing some type of arithmetic or logic operation, as determined by the translation routine. In one example, the guest instructions that are fetched and translated into native instructions may be instructions of the fairness evaluation facility used to test the devices under test.

Each routine is, for instance, implemented in software, which is stored in memory and executed by native central processing unit 202. In other examples, one or more of the routines or operations are implemented in firmware, hardware, software or some combination thereof. The registers of the emulated processor may be emulated using registers 210 of the native CPU or by using locations in memory 204. In embodiments, guest instructions 250, native instructions 256 and emulator code 212 may reside in the same memory or may be disbursed among different memory devices.

As used herein, firmware includes, e.g., the microcode, millicode and/or macrocode of the processor. It includes, for instance, the hardware-level instructions and/or data structures used in implementation of higher level machine code. In one embodiment, it includes, for instance, proprietary code that is typically delivered as microcode that includes trusted software or microcode specific to the underlying hardware and controls operating system access to the system hardware.

The computing environments described above are only examples of computing environments that can be used. Other environments, including but not limited to, other non-partitioned environments, partitioned environments, and/or other emulated environments, may be used; embodiments are not limited to any one environment or to any particular architecture or system.

Fairness evaluation logic executed by one or more processors of a computing environment is used to test a device under test. In particular, in this example, the fairness evaluation logic is used to evaluate fairness for the device under test. The device under test may be of many designs, but in the example described herein, it is a cache, such as an L3 cache, design. However, this is only one example of a design that may be tested pre-silicon.

Figure 3A:
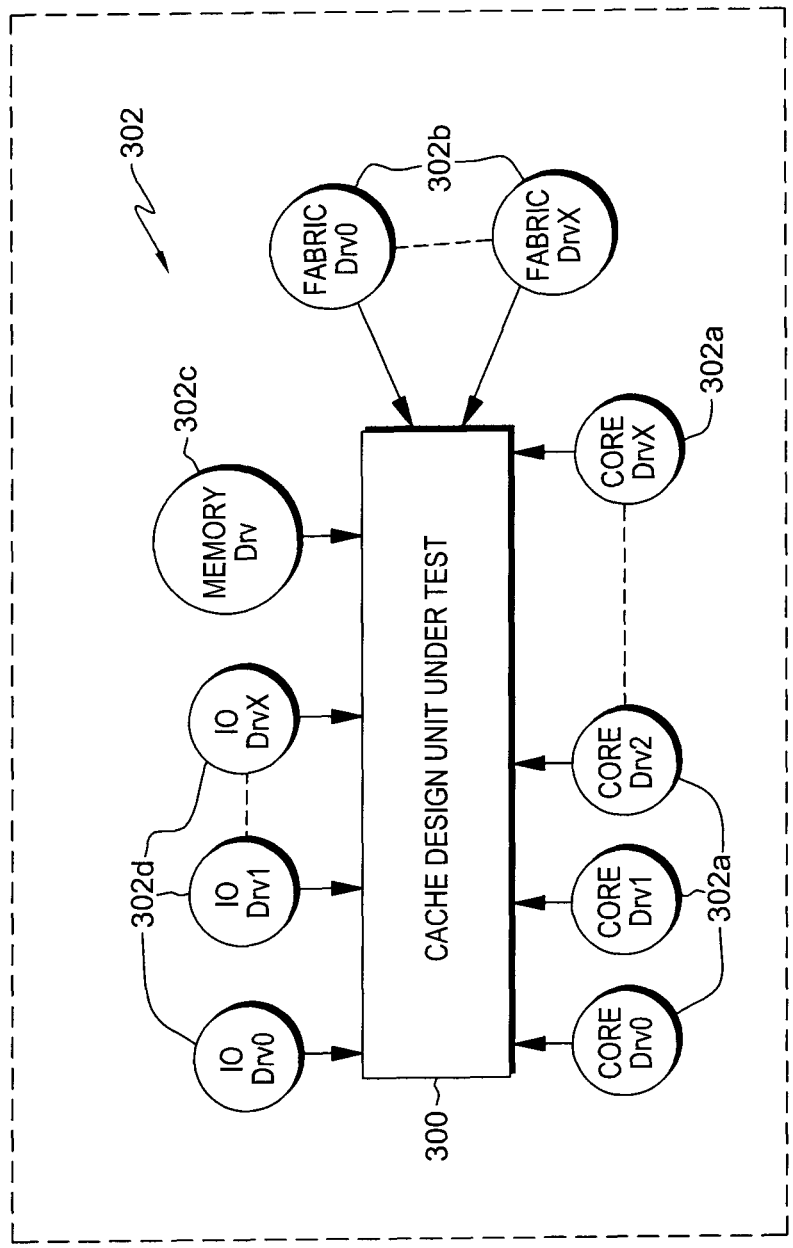
FIG. 3A depicts one example of a device under test with a plurality of drivers driving traffic on interfaces of the device under test.

Referring to FIG. 3A, in one embodiment, traffic (e.g., commands, instructions, etc.) is driven on interfaces of a device under test 300, such as a cache design, by a plurality of drivers 302. As used herein, a driver is any entity used to drive traffic on the device under test. In one embodiment, the driver drives traffic on the interfaces of the device under test, and therefore, may be referred to as an interface driver. A particular example of a driver is a bus functional model, which may be defined as tasks in, for instance, hardware description languages. The drivers may be of different types. For instance, in this example, the drivers include processing cores 302a, fabric drivers 302b, memory drivers 302c, and input/output (I/O) drivers 302d, each of which executes on a processor and drives traffic on the device under test, as appropriate for the type of driver.

Conventionally, each driver drives traffic on the device under test until a fixed quiesce time (e.g., 50,000 cycles), which is predefined prior to a start of the test, is reached. When the fixed quiesce time is reached, the driver stops driving traffic. However, by stopping the traffic at fixed points, a fairness issue may be masked, since outstanding traffic—even if previously not making expected forward progress due to a fairness issue—is allowed to finish. Thus, in accordance with one or more aspects, fairness is evaluated based on a state of the driver, instead of a fixed quiesce point, such as a fixed cycle count. In one embodiment, a global driver control facilitates in evaluating fairness based on the driver state.

Figure 3B:
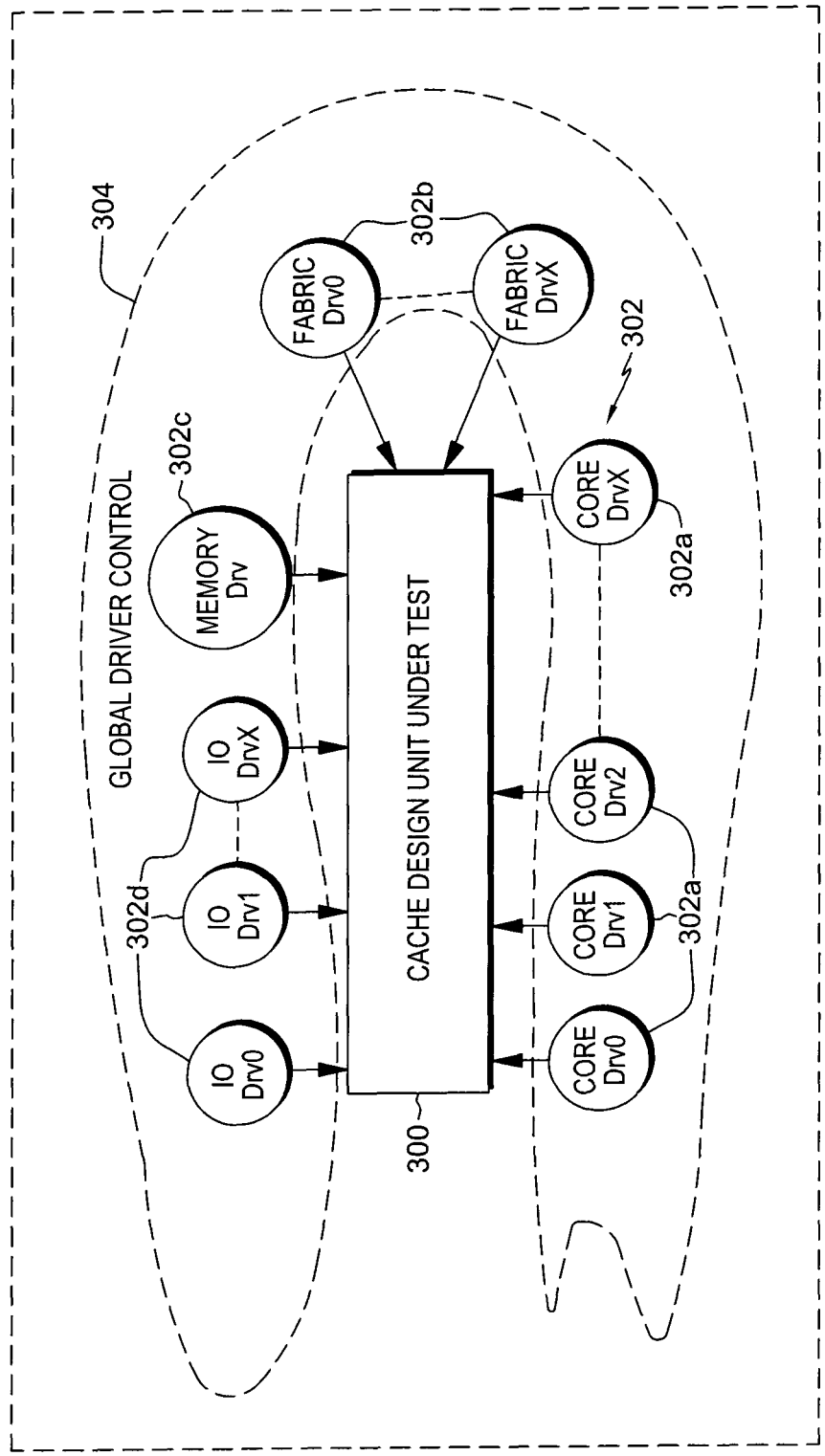
FIG. 3B depicts one example of a global driver control to be used to manage the plurality of drivers of FIG. 3A.

Referring to FIG. 3B, in one embodiment, a global driver control 304 executing on a processor within the computing environment is used, in one or more aspects, in controlling the individual instances of drivers 302. The global driver control maintains state information associated with the drivers, such as, for instance, status relating to the traffic driven by the drivers, and this information is used by the fairness evaluation logic to control the driving of traffic by the drivers, and thus, discover fairness problems in pre-silicon designs under test.

One embodiment of fairness evaluation logic used to test a device under test is described with reference to FIG. 4. In one example, this logic is performed by each driver to test the device under test.

Figure 4:
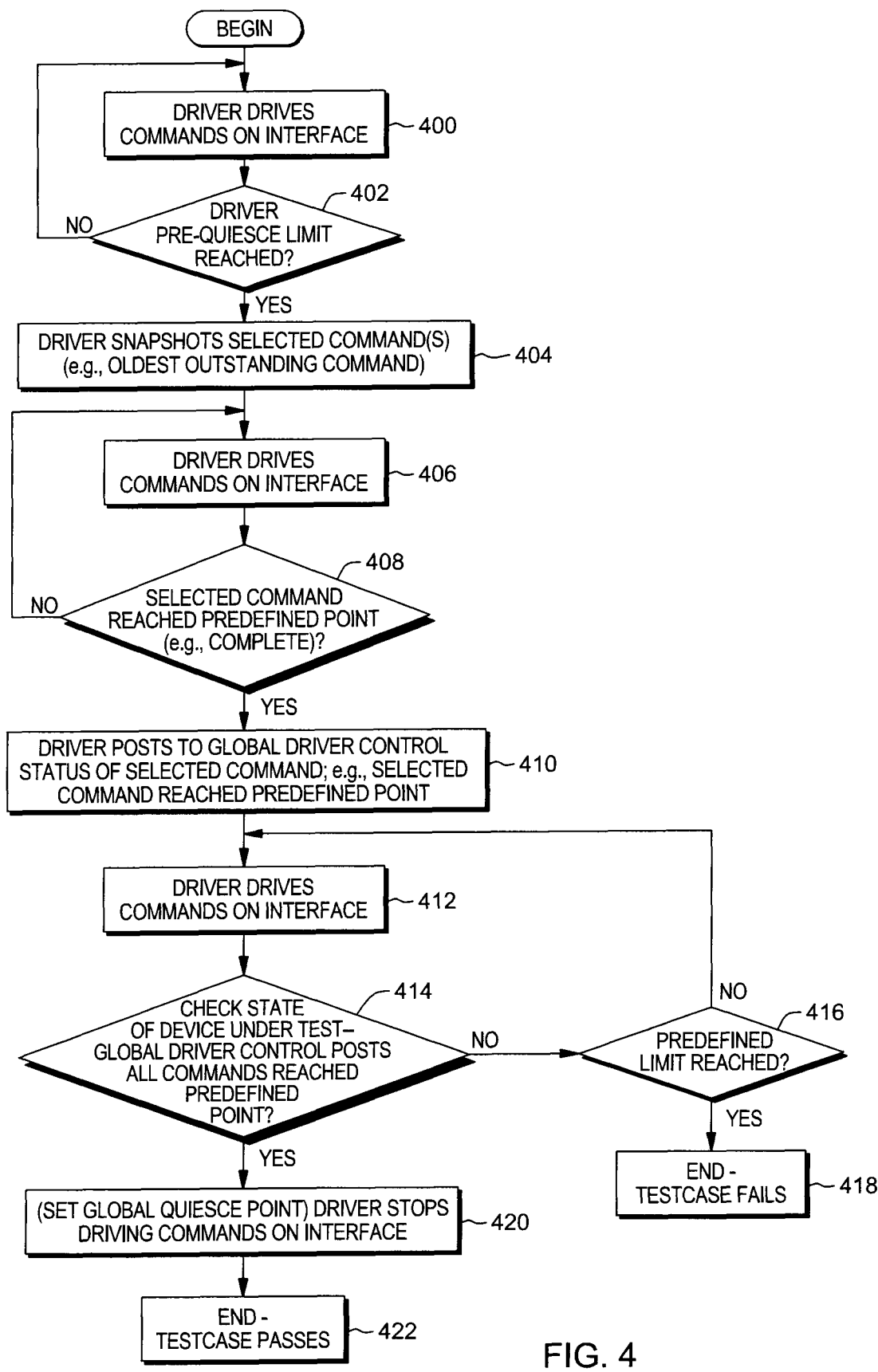
FIG. 4 depicts one embodiment of logic to evaluate fairness in a device under test, in accordance with one or more aspects.

Referring to FIG. 4, initially, a simulation interface driver, such as a bus functional model, drives commands on its interface of the device under test, STEP 400. A determination is made, at preselected intervals, whether a pre-quiesce limit associated with the driver has been reached, INQUIRY 402. The pre-quiesce limit is a parameter set by the user for the driver to be used to determine whether state for the driver is to be collected. The pre-quiesce limit is, for instance, based on processing cycles, but could be based on other criteria. In one particular example, it is set at 30,000 cycles; however, other criteria may be used.

If the driver pre-quiesce limit has not been reached, INQUIRY 402, then the driver continues to drive commands, STEP 400. However, if the driver pre-quiesce limit has been reached, INQUIRY 402, then the driver takes a snapshot of one or more selected commands that have been driven on the device under test by the driver, STEP 404. In one example, the one or more selected commands include the oldest outstanding command that has been driven; i.e., the longest executing command with reference to a parameter, such as time, cycle count, etc. It is the longest executing command or oldest outstanding command as compared to other commands driven by the driver and currently executing. However, in other embodiments, other commands may be selected, such as all the commands or some other subset of commands, etc. This snapshot includes, for instance, a sequence identifier of the command, a command code point type (e.g., read-only fetch), address of the command, and the time presented on the interface.

The driver continues to drive commands on the interface, STEP 406, and determines, at predefined intervals, whether the selected command (e.g., the longest executing command) has reached a predefined point (e.g., completion), INQUIRY 408. If the selected command has not reached the predefined point, then the driver continues to drive commands on the interface, STEP 406. However, if the driver determines that the selected command has reached the predefined point, then the driver posts to the global driver control that the selected command for this driver has reached the predefined point, STEP 410. That is, the driver provides status of the selected command. The driver continues to drive commands on the interface, STEP 412.

The driver inquires, at preselected intervals, as to whether the global driver control has indicated that all of the drivers driving traffic against the device under test have indicated that their selected commands (e.g., each driver's longest executing command) have reached the predefined point (e.g., completion), INQUIRY 414. That is, the driver checks state of the device under test. If the global driver control has not indicated that all of the drivers have posted that their selected commands have reached the predefined point, then a further determination is made as to whether a predefined limit (e.g., a hang time) has been reached, INQUIRY 416. The predefined limit is set, for instance, by the user for each driver at the start of the test. The value for the limit may be the same for each driver or different limits for one or more drivers. As one example, the limit is set as, for instance, a number of cycles (e.g., 80,000 cycles); however, other limits and other types of limits may be used. Further, in one embodiment, the predefined limit may be dynamically adjusted or set, during the test, based on the type of commands being executed and/or execution characteristics of the commands.

If the predefined limit is not reached, then the driver continues to drive commands against the device under test, STEP 412. However, if the predefined limit is reached, then the test fails indicating a lack of fairness in the device under test, STEP 418. In particular, one or more commands being driven by this particular driver against the device under test are considered as failed, indicating a lack of fairness (e.g., did not receive the resources needed for forward progress in an acceptable time).

Returning to INQUIRY 414, if the driver determines that the global driver control has indicated that all of the selected commands have reached the predefined point, then the driver stops driving commands on the interface, STEP 420. For instance, a global quiesce point (e.g., quiesce time) is dynamically set by the global driver control during execution of the test based on the driver state (e.g., status of the selected commands). The global quiesce point is used by each of the drivers to stop driving commands on the interfaces being used to test the device under test. Thus, the test passes, STEP 422. That is, no fairness issue is determined in the device under test.

Described in detail herein is a simulation test environment that supports a driver pre-quiesce time, which is set by the user as a parameter for the testcase. In one embodiment, the simulation drivers in the system capture, e.g., their oldest outstanding command at the driver pre-quiesce time. Further, the test environment supports a global driver control which is used to dynamically determine a driver final quiesce time. Each individual driver in the system posts to the global driver control when, e.g., their oldest outstanding command has completed. The global driver sets the driver final quiesce time when all of the individual drivers in the system have posted to the global driver control that, e.g., the oldest outstanding command has completed. Each individual driver in the system continues to drive traffic on their respective interface until the dynamically set driver final quiesce time.

The test environment supports a parameter to set a hang limit for the oldest outstanding commands and fail upon that condition. The parameter is set, per instance of each driver, at the start on the testcase. If a driver instance detects that its oldest outstanding command is still active upon reaching this hang limit, the testcase will fail and indicates the failing command.

In one embodiment, the dynamic setting of driver quiesce time across the system is based on driver state (e.g., completion of oldest command), rather than based on cycle count. It is dynamically set during execution of the test, rather than predefined and fixed prior to the start of the test. As indicated, the technique includes dynamically setting the driver quiesce time globally, for all drivers in the system under test, including drivers of different interface types. A snapshot state of drivers is used to influence future input streams. The snapshot state of one driver influences the quiesce time for all drivers in the system. Drivers are evaluated against each other for fairness even though drivers can represent different traffic. Drivers behave without fixed constraints of sending fixed predefined numbers of commands and then stopping, etc.

Figure 5A:
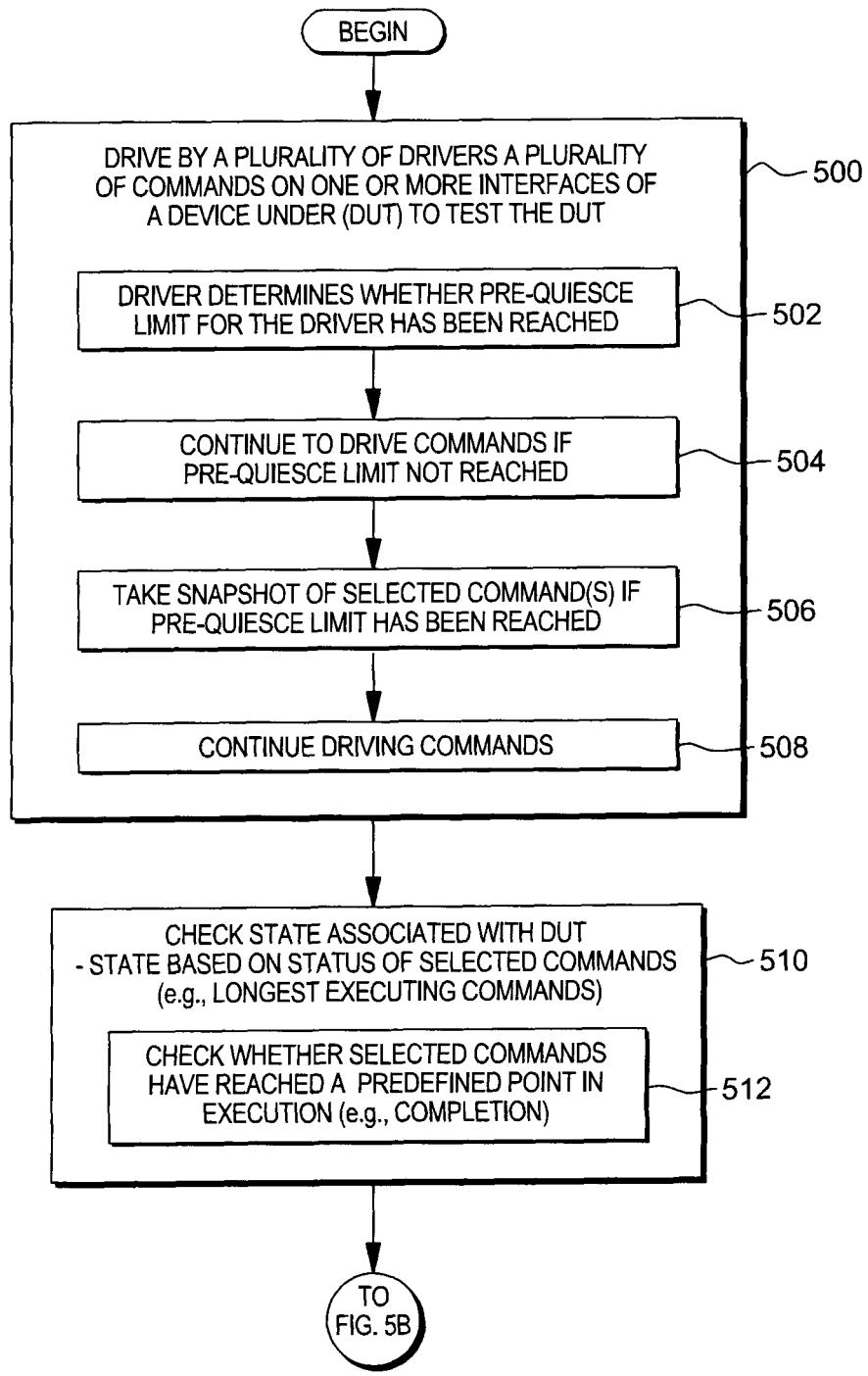
FIGS. 5A-5B also depict one embodiment of logic to evaluate fairness in a device under test, in accordance with one or more aspects.
Figure 5B:
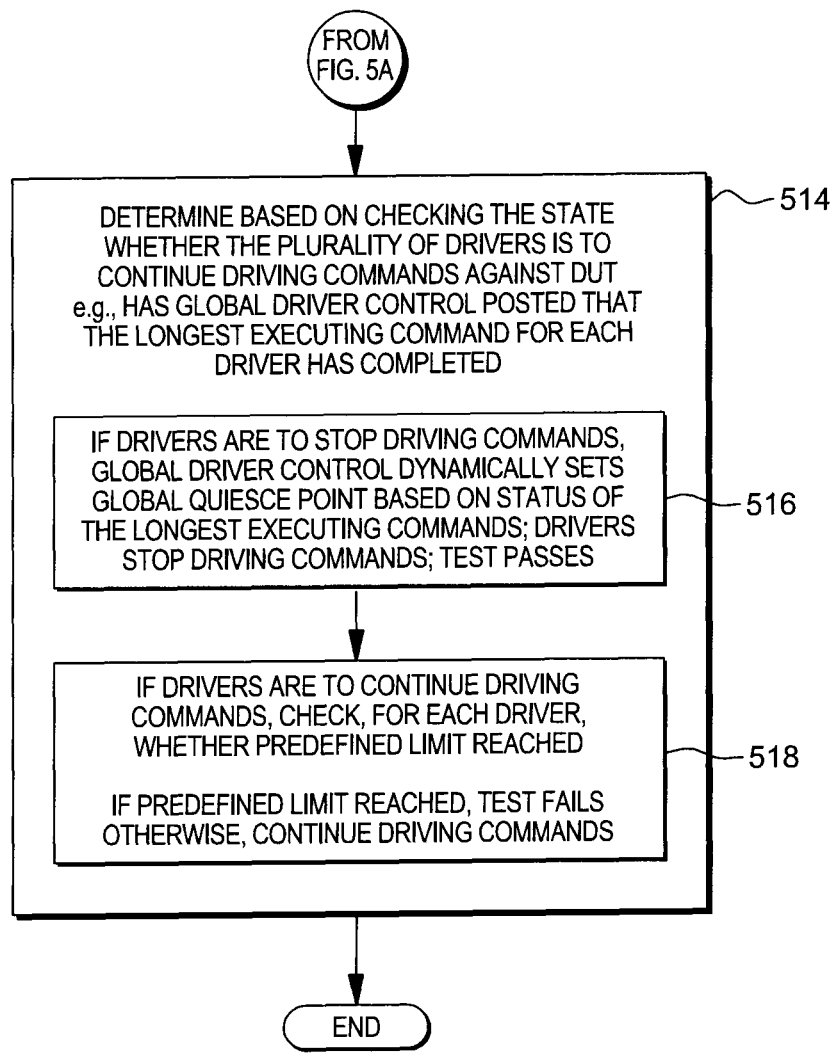

To further describe, with reference to FIGS. 5A-5B, in one embodiment, a plurality of drivers drive a plurality of commands on one or more interfaces of a device under test to test the device under test, STEP 500 (FIG. 5A). For instance, each driver drives commands on its interface and determines whether a pre-quiesce limit set for the driver has been reached, STEP 502. If the pre-quiesce limit for the driver has not been reached, then the driver continues to drive commands on the device under test, STEP 504. However, if the pre-quiesce limit has been reached, then a snapshot of one or more selected commands is taken, STEP 506. In one example, the snapshot is of the oldest outstanding or longest executing command for the driver. The driver continues driving commands, STEP 508.

Further, state associated with the device under test is checked, STEP 510. For instance, the state is based on the status of selected commands (e.g., the longest executing commands) driven by the plurality of drivers. For example, a check is made as to whether the selected commands have reached a predefined point in execution, STEP 512. That is, in one example, has the longest executing command for each driver reached completion.

Based on checking this state, a determination is made as to whether the plurality of drivers is to continue driving commands against the device under test, STEP 514 (FIG. 5B). That is, has the global driver control posted that the longest executing command for each driver has completed. If the drivers are to stop driving commands because all the selected commands have reached the predefined point, then the global driver control sets a global quiesce point, STEP 516. This is set dynamically (e.g., during execution of the test) based on status of the longest executing commands. The drivers stop driving commands and the test passes.

However, if the drivers are to continue driving commands, since the global driver control has not posted that the selected commands have reached the predefined point, then a further check is made for each driver as to whether a predefined limit has been reached, STEP 518. If the predefined limit has been reached, then the test is to end (e.g., stop driving commands), and the test fails; otherwise, the driver continues driving commands.

Described in detail herein is a technique to discover a class of problems historically difficult to uncover via pre-silicon random simulation, such as livelock, starvation, fairness and priority issues, collectively referred to herein as fairness issues or problems. Such issues are difficult to discover in current random simulation methodology due to the way interface drivers are quiesced at a pre-determined, fixed cycle. The issues are masked by the fact that new commands are no longer driven on the interface after a fixed cycle, allowing outstanding traffic—even if previously not making expected forward progress due to a fairness issue—to finish within the run out period of the testcase. However, in accordance with one or more aspects, fairness issues, such as starvation, fairness, livelock and priority problems, are discovered pre-silicon, saving test floor debug time and a need to fix such problems in additional passes of silicon. The result is higher quality design at a lower cost and savings to schedule.

As will be appreciated by one of average skill in the art, aspects of embodiments may be embodied as a system, method or computer program product. Accordingly, aspects of embodiments may take the form of an entirely hardware embodiment, an entirely software embodiment (including firmware, resident software, micro-code, etc.) or an embodiment combining software and hardware aspects that may all generally be referred to herein as, for example, a "circuit," "module" or "system." Furthermore, aspects of embodiments may take the form of a computer program product embodied in one or more computer readable storage device(s) having computer readable program code embodied thereon.

One or more of the capabilities of embodiments can be implemented in software, firmware, hardware, or some combination thereof. Further, one or more of the capabilities can be emulated.

Figure 6:
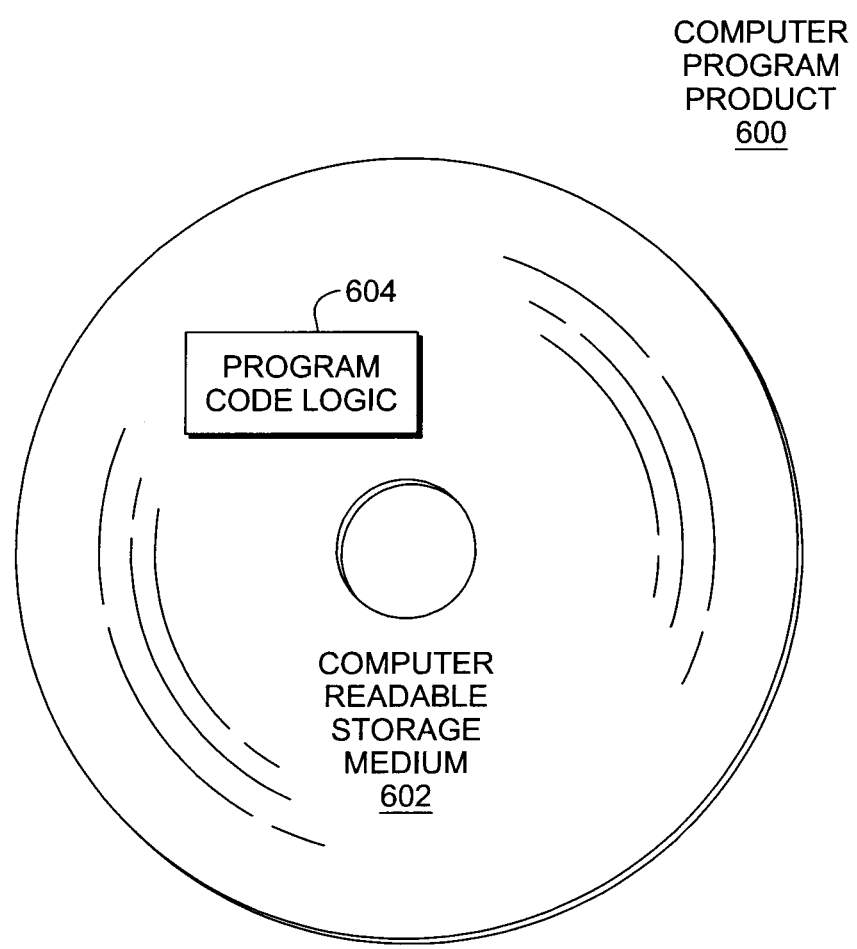
FIG. 6 depicts one embodiment of a computer program product incorporating one or more aspects.

Referring to FIG. 6, in one example, a computer program product 600 includes, for instance, one or more non-transitory computer readable storage media 602 to store computer readable program code means, logic and/or instructions 504 thereon to provide and facilitate one or more embodiments.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different states may be used, and the drivers may be of different types. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

In a further embodiment, one or more aspects relate to cloud computing. It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for loadbalancing between clouds).

A cloud computing environment is service oriented with a focus on statelessness, low coupling, modularity, and semantic interoperability. At the heart of cloud computing is an infrastructure comprising a network of interconnected nodes.

Figure 7:
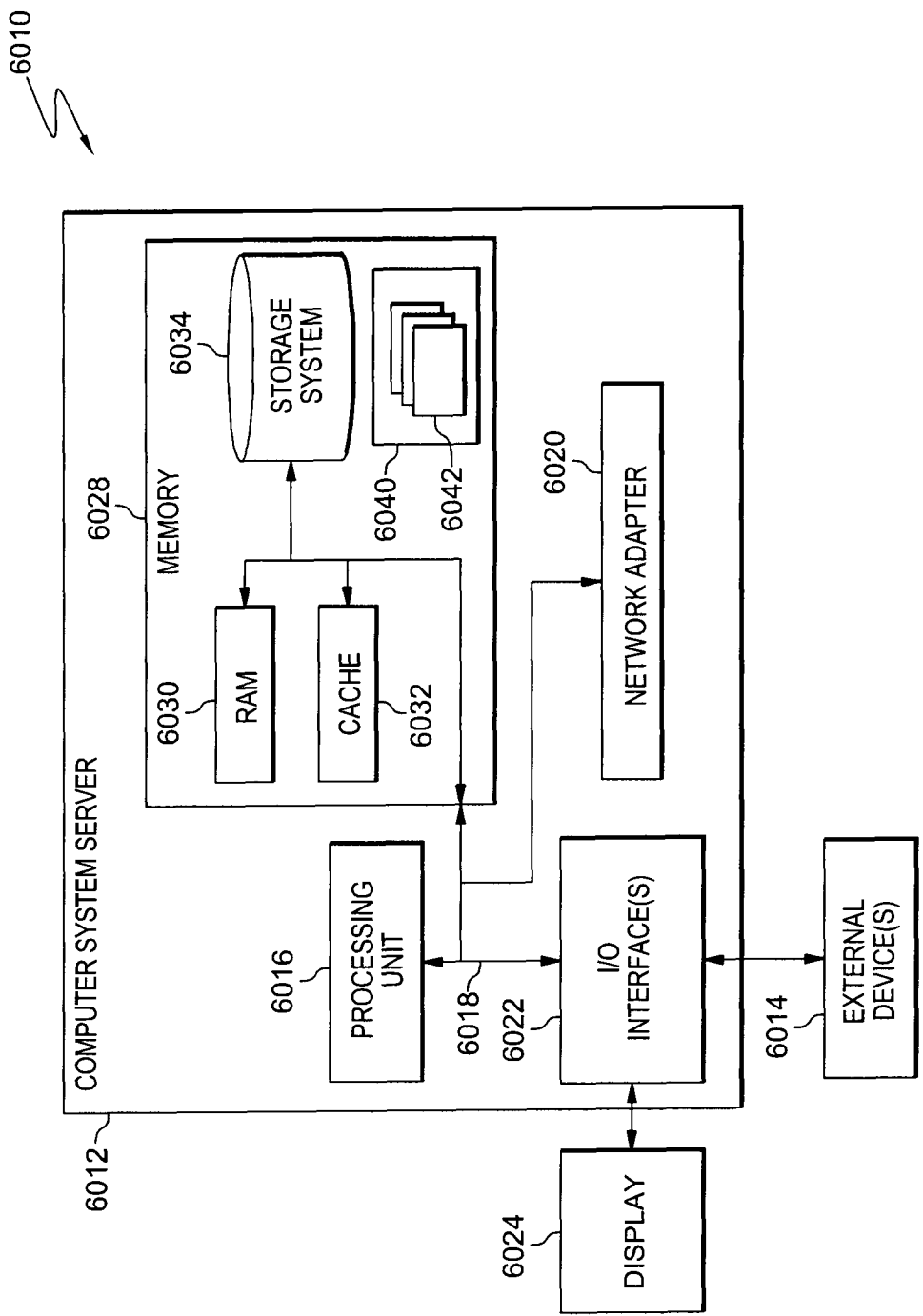
FIG. 7 depicts one embodiment of a cloud computing node.

Referring now to FIG. 7, a schematic of an example of a cloud computing node is shown. Cloud computing node 6010 is only one example of a suitable cloud computing node and is not intended to suggest any limitation as to the scope of use or functionality of embodiments of the invention described herein. Regardless, cloud computing node 6010 is capable of being implemented and/or performing any of the functionality set forth hereinabove.

In cloud computing node 6010 there is a computer system/server 6012, which is operational with numerous other general purpose or special purpose computing system environments or configurations. Examples of well-known computing systems, environments, and/or configurations that may be suitable for use with computer system/server 6012 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 6012 may be described in the general context of computer system executable instructions, such as program modules, being executed by a computer system. Generally, program modules may include routines, programs, objects, components, logic, data structures, and so on that perform particular tasks or implement particular abstract data types. Computer system/server 6012 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computer system/server 6012 in cloud computing node 6010 is shown in the form of a general-purpose computing device. The components of computer system/server 6012 may include, but are not limited to, one or more processors or processing units 6016, a system memory 6028, and a bus 6018 that couples various system components including system memory 6028 to processor 6016.

Bus 6018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 6012 typically includes a variety of computer system readable media. Such media may be any available media that is accessible by computer system/server 6012, and it includes both volatile and non-volatile media, removable and non-removable media.

System memory 6028 can include computer system readable media in the form of volatile memory, such as random access memory (RAM) 6030 and/or cache memory 6032. Computer system/server 6012 may further include other removable/non-removable, volatile/non-volatile computer system storage media. By way of example only, storage system 6034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 6018 by one or more data media interfaces. As will be further depicted and described below, memory 6028 may include at least one program product having a set (e.g., at least one) of program modules that are configured to carry out the functions of embodiments of the invention.

Program/utility 6040, having a set (at least one) of program modules 6042, may be stored in memory 6028 by way of example, and not limitation, as well as an operating system, one or more application programs, other program modules, and program data. Each of the operating system, one or more application programs, other program modules, and program data or some combination thereof, may include an implementation of a networking environment. Program modules 6042 generally carry out the functions and/or methodologies of embodiments of the invention as described herein.

Computer system/server 6012 may also communicate with one or more external devices 6014 such as a keyboard, a pointing device, a display 6024, etc.; one or more devices that enable a user to interact with computer system/server 6012; and/or any devices (e.g., network card, modem, etc.) that enable computer system/server 6012 to communicate with one or more other computing devices. Such communication can occur via Input/Output (I/O) interfaces 6022. Still yet, computer system/server 6012 can communicate with one or more networks such as a local area network (LAN), a general wide area network (WAN), and/or a public network (e.g., the Internet) via network adapter 6020. As depicted, network adapter 6020 communicates with the other components of computer system/server 6012 via bus 6018. It should be understood that although not shown, other hardware and/or software components could be used in conjunction with computer system/server 6012. Examples, include, but are not limited to: microcode, device drivers, redundant processing units, external disk drive arrays, RAID systems, tape drives, and data archival storage systems, etc.

Figure 8:
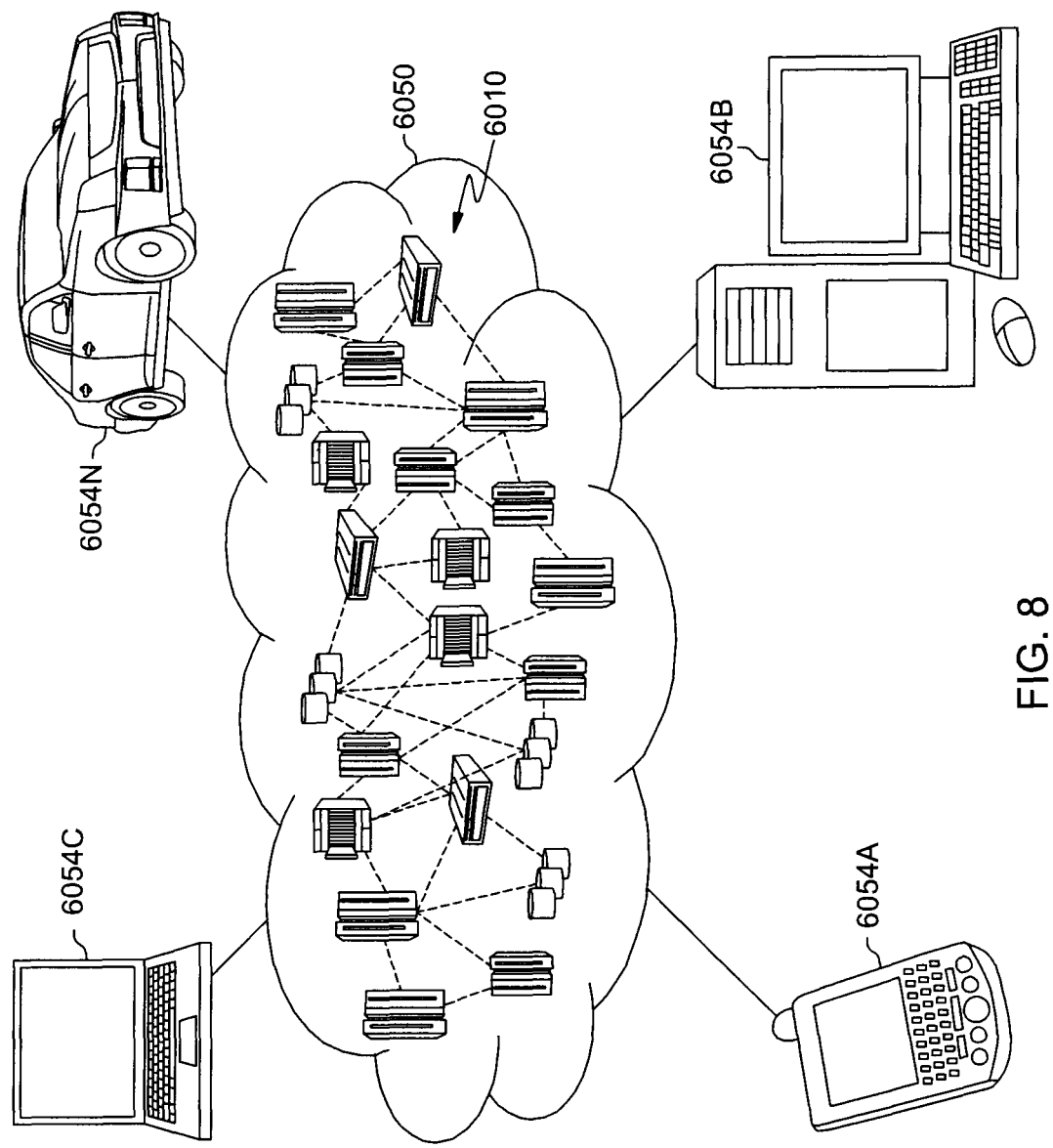
FIG. 8 depicts one embodiment of a cloud computing environment.

Referring now to FIG. 8, illustrative cloud computing environment 6050 is depicted. As shown, cloud computing environment 6050 comprises one or more cloud computing nodes 6010 with which local computing devices used by cloud consumers, such as, for example, personal digital assistant (PDA) or cellular telephone 6054A, desktop computer 6054B, laptop computer 6054C, and/or automobile computer system 6054N may communicate. Nodes 6010 may communicate with one another. They may be grouped (not shown) physically or virtually, in one or more networks, such as Private, Community, Public, or Hybrid clouds as described hereinabove, or a combination thereof. This allows cloud computing environment 6050 to offer infrastructure, platforms and/or software as services for which a cloud consumer does not need to maintain resources on a local computing device. It is understood that the types of computing devices 6054A-N shown in FIG. 8 are intended to be illustrative only and that computing nodes 6010 and cloud computing environment 6050 can communicate with any type of computerized device over any type of network and/or network addressable connection (e.g., using a web browser).

Figure 9:
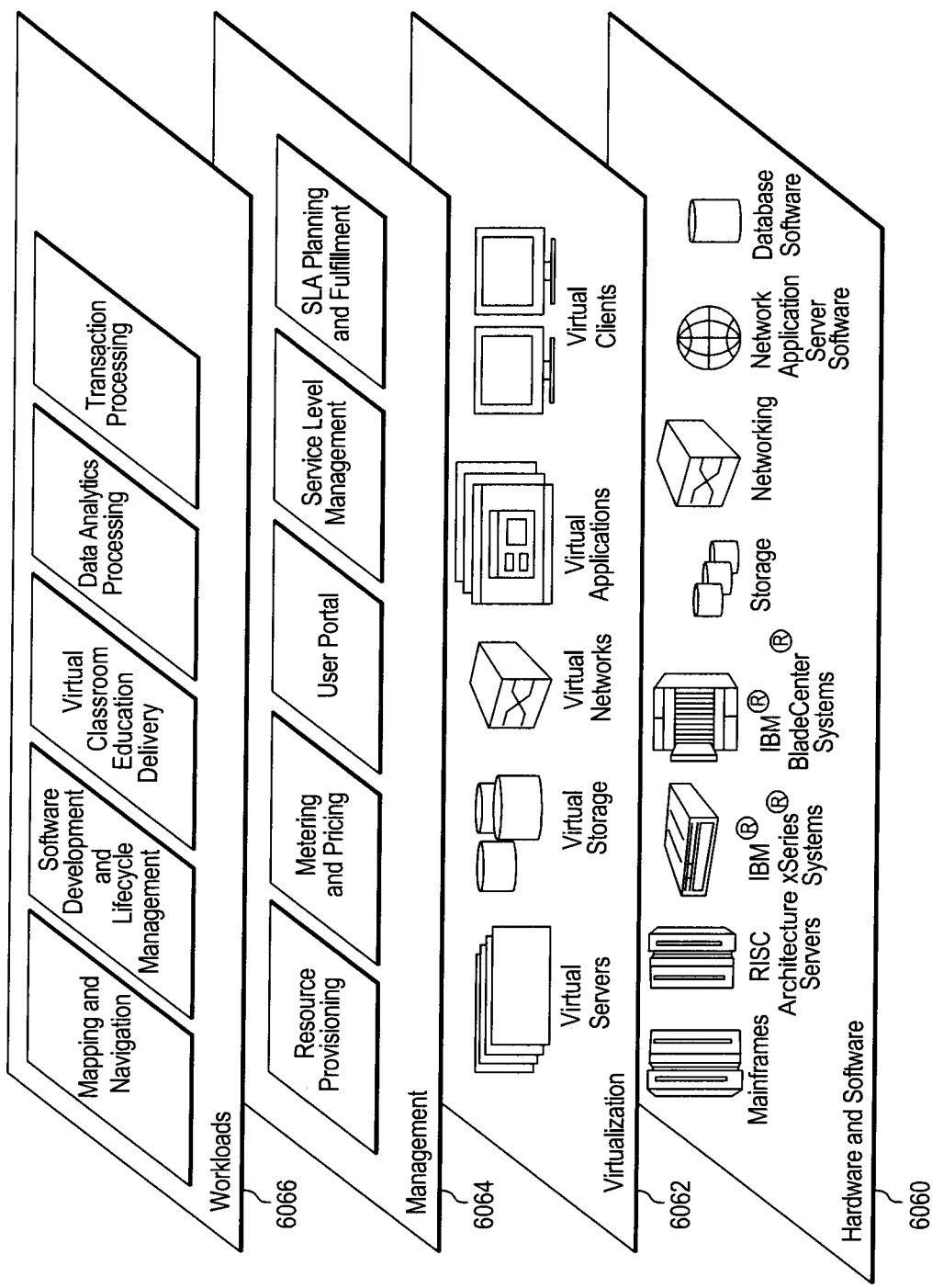
FIG. 9 depicts one example of abstraction model layers.

Referring now to FIG. 9, a set of functional abstraction layers provided by cloud computing environment 6050 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 6060 includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components.

Examples of software components include network application server software, in one example IBM Web Sphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer 6062 provides an abstraction layer from which the following examples of virtual entities may be provided: virtual servers; virtual storage; virtual networks, including virtual private networks; virtual applications and operating systems; and virtual clients.

In one example, management layer 6064 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 6066 provides examples of functionality for which the cloud computing environment may be utilized. Examples of workloads and functions which may be provided from this layer include: mapping and navigation; software development and lifecycle management; virtual classroom education delivery; data analytics processing; and transaction processing.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method of evaluating fairness in devices under test, said computer-implemented method comprising:
    driving, by a plurality of drivers executing on one or more processors of a computing environment, a plurality of commands on one or more interfaces of a device under test to test the device under test in pre-silicon processing for fairness;
    checking state associated with the device under test;
    determining, based on the state, whether a quiesce point is to be dynamically set for the plurality of drivers, the quiesce point to indicate to the plurality of drivers to stop driving commands against the device under test;
    setting, based on the determining indicating the quiesce point is to be set, the quiesce point dynamically, based on the state, to stop driving commands against the device under test and successfully ending the test;
    deciding, based on the determining indicating the quiesce point is not to be set, whether commands are to continue to be driven, the deciding being based on a predefined limit, and wherein based on deciding that the commands are not to continue to be driven, failing the test due to at least one fairness problem in which forward progress is not being made for one or more commands being driven on at least one interface of the one or more interfaces; and
    initiating correcting of the at least one fairness problem pre-silicon to provide a design of an actual device without the at least one fairness problem to be tested in post-silicon validation testing.

2. The computer-implemented method of claim 1, wherein the state is based on status of selected commands driven by the plurality of drivers, and wherein the quiesce point is dynamically set based on the status of the selected commands.

3. The computer-implemented method of claim 1, wherein fairness indicates whether forward progress is being made for the plurality of commands being driven on the one or more interfaces.

4. The computer-implemented method of claim 1, wherein the state is based on status of selected commands driven by the plurality of drivers.

5. The computer-implemented method of claim 4, wherein the selected commands comprise commands that have been executing the longest with reference to a selected parameter.

6. The computer-implemented method of claim 1, wherein the plurality of drivers comprises drivers of multiple types.

7. The computer-implemented method of claim 1, wherein the device under test is a cache.

8. The computer-implemented method of claim 1, wherein the driving the plurality of commands comprises driving one or more commands by a driver of the plurality of drivers, wherein the driving the one or more commands by the driver comprises:
    determining whether a pre-quiesce limit for the driver has been reached;
    continuing to drive commands based on the determining indicating the pre-quiesce limit has not been reached; and
    taking a snapshot of a selected command driven by the driver based on the determining indicating the pre-quiesce limit has been reached, and continuing to drive commands on the device under test.

9. The computer-implemented method of claim 8, wherein the selected command includes a command driven by the driver that is executing the longest with reference to a selected parameter, and taking the snapshot comprises obtaining information regarding the command executing the longest.

10. A computer system for evaluating fairness in devices under test, said computer system comprising:
   a memory; and
   a processor in communication with the memory, wherein the computer system is configured to perform a method, said method comprising:
      driving, by a plurality of drivers executing on one or more processors of a computing environment, a plurality of commands on one or more interfaces of a device under test to test the device under test in pre-silicon processing for fairness;
      checking state associated with the device under test;
      determining, based on the state, whether a quiesce point is to be dynamically set for the plurality of drivers, the quiesce point to indicate to the plurality of drivers to stop driving commands against the device under test;
      setting, based on the determining indicating the quiesce point is to be set, the quiesce point dynamically, based on the state, to stop driving commands against the device under test and successfully ending the test;
      deciding, based on the determining indicating the quiesce point is not to be set, whether commands are to continue to be driven, the deciding being based on a predefined limit, and wherein based on deciding that the commands are not to continue to be driven, failing the test due to at least one fairness problem in which forward progress is not being made for one or more commands being driven on at least one interface of the one or more interfaces; and
      initiating correcting of the at least one fairness problem pre-silicon to provide a design of an actual device without the at least one fairness problem to be tested in post-silicon validation testing.

11. The computer system of claim 10, wherein the state is based on status of selected commands driven by the plurality of drivers, and wherein the quiesce point is dynamically set based on the status of the selected commands.

12. The computer system of claim 10, wherein fairness indicates whether forward progress is being made for the plurality of commands being driven on the one or more interfaces.

13. The computer system of claim 10, wherein the state is based on status of selected commands driven by the plurality of drivers, and wherein the selected commands comprise commands that have been executing the longest with reference to a selected parameter.

14. The computer system of claim 10, wherein the plurality of drivers comprises drivers of multiple types.

15. The computer system of claim 10, wherein the device under test is a cache.

16. A computer program product for evaluating fairness in devices under test, said computer program product comprising:
   a computer readable storage medium readable by a processing circuit and storing instructions for performing a method comprising:
      driving, by a plurality of drivers executing on one or more processors of a computing environment, a plurality of commands on one or more interfaces of a device under test to test the device under test in pre-silicon processing for fairness;
      checking state associated with the device under test;
      determining, based on the state, whether a quiesce point is to be dynamically set for the plurality of drivers, the quiesce point to indicate to the plurality of drivers to stop driving commands against the device under test;
      setting, based on the determining indicating the quiesce point is to be set, the quiesce point dynamically, based on the state, to stop driving commands against the device under test and successfully ending the test;
      deciding, based on the determining indicating the quiesce point is not to be set, whether commands are to continue to be driven, the deciding being based on a predefined limit, and wherein based on deciding that the commands are not to continue to be driven, failing the test due to at least one fairness problem in which forward progress is not being made for one or more commands being driven on at least one interface of the one or more interfaces; and
      initiating correcting of the at least one fairness problem pre-silicon to provide a design of an actual device without the at least one fairness problem to be tested in post-silicon validation testing.

17. The computer program product of claim 16, wherein the state is based on status of selected commands driven by the plurality of drivers, and wherein the quiesce point is dynamically set based on the status of the selected commands.

18. The computer program product of claim 16, wherein fairness indicates whether forward progress is being made for the plurality of commands being driven on the one or more interfaces.

19. The computer program product of claim 16, wherein the state is based on status of selected commands driven by the plurality of drivers, and wherein the selected commands comprise commands that have been executing the longest with reference to a selected parameter.

20. The computer program product of claim 16, wherein the device under test is a cache.

* * * * *